(12) United States Patent
Eberlein

(10) Patent No.: US 7,075,803 B2
(45) Date of Patent: Jul. 11, 2006

(54) FREQUENCY STABILIZATION TECHNIQUE FOR SELF OSCILLATING MODULATOR

(75) Inventor: Matthias Eberlein, Gilching (DE)

(73) Assignee: Dialog Semiconductor GmbH, Kirchheim/Teck-Nabern (DE)

( * ) Notice: Subject to any disclaimer, the term of this patent is extended or adjusted under 35 U.S.C. 154(b) by 67 days.

(21) Appl. No.: 10/990,009

(22) Filed: Nov. 16, 2004

(65) Prior Publication Data

US 2006/0103362 A1    May 18, 2006

(30) Foreign Application Priority Data

Nov. 12, 2004   (EP) .................................. 04392039

(51) Int. Cl.
  *H02M 1/12* (2006.01)
  *H05B 5/20* (2006.01)
(52) U.S. Cl. ..................................... 363/41; 331/177 R
(58) Field of Classification Search .................... 363/9, 363/39, 41, 43, 164, 165; 323/284; 331/135, 331/177 R; 330/10, 207 A
See application file for complete search history.

(56) References Cited

U.S. PATENT DOCUMENTS

| 4,489,371 | A | * | 12/1984 | Kernick ........................ 363/41 |
| 5,160,896 | A | | 11/1992 | McCorkle .................... 330/251 |
| 5,345,165 | A | | 9/1994 | Froeschle .................... 323/284 |
| 5,594,386 | A | | 1/1997 | Dhuyvetter ................... 330/251 |
| 6,107,875 | A | | 8/2000 | Pullen et al. .................. 330/10 |
| 6,166,566 | A | | 12/2000 | Strong .......................... 327/72 |
| 6,297,693 | B1 | | 10/2001 | Pullen .......................... 330/10 |
| 6,337,545 | B1 | | 1/2002 | Kwon .......................... 315/408 |
| 6,348,780 | B1 | | 2/2002 | Grant .......................... 323/222 |
| 6,441,693 | B1 | | 8/2002 | Lange et al. ................. 331/143 |
| 2003/0030486 | A1 | | 2/2003 | Noro et al. .................... 330/10 |

FOREIGN PATENT DOCUMENTS

EP        087506 A       3/2001

OTHER PUBLICATIONS

M.T. Tan et al. "Novel self-error-correction pulse width modulator for a class D hearing instrument amplifier", IEE Proc.: Circuits Data & Sys., Inst. of Elec. Eng., Stevenage, GB, vol. 148, No. 5, Oct. 8, 2001.

J. H. Jeong et al., "A Class D Switching Power Amplifier with High Efficiency and Wide Bandwidth by Duel Feedback Loops", Int'l Conf. on Cons. Elec.-Digest of Tech. Papers, Rosemont, Jun. 7-9, 1995, NY, IEEE, US, vol. CONF 14, pp. 428-429.

* cited by examiner

*Primary Examiner*—Jessica Han
(74) *Attorney, Agent, or Firm*—Saile Ackerman LLC; Stephen B. Ackerman

(57) ABSTRACT

With self oscillating pulse width modulators, using a hysteretic comparator to change the output duty cycle according to the input signal, as often used for example for Class-D amplifiers or switching regulators, the frequency varies with output power and supply voltage. The disclosed invention presents a method to drastically reduce the frequency variation by introducing the combination of an analog and a digital feedback loop to shift the hysteretic threshold, ideally by providing a single absolute value, which is proportional to the pulse frequency and by alternating the polarity of shifting the hysteretic threshold, based on the actual output pulse phase.

35 Claims, 5 Drawing Sheets

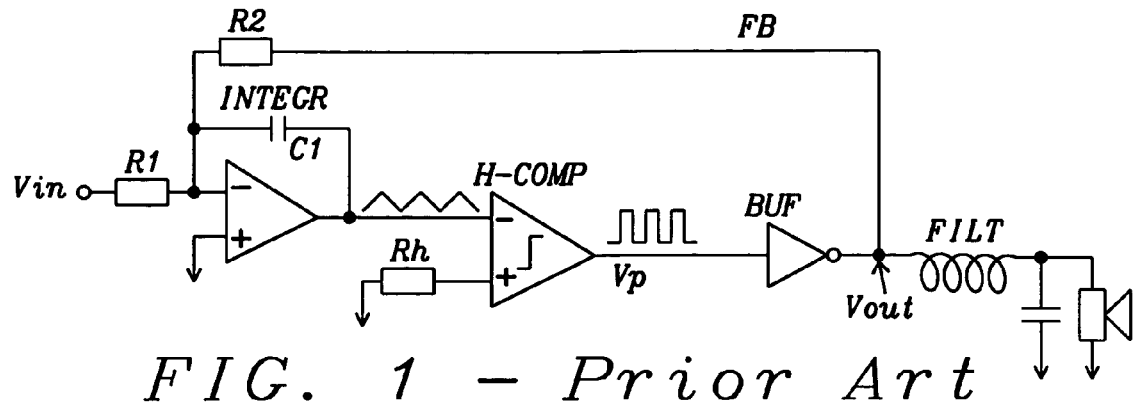
FIG. 1 – Prior Art
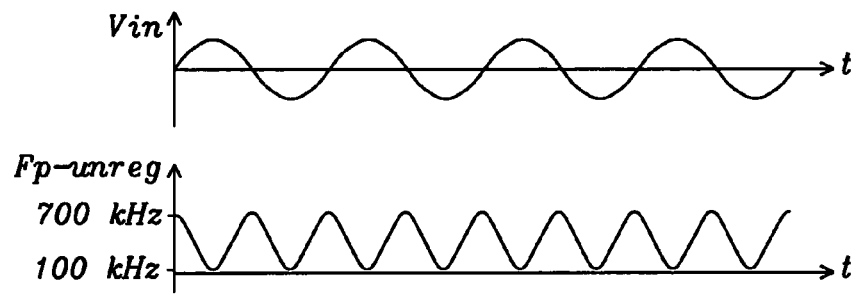
FIG. 2 – Prior Art
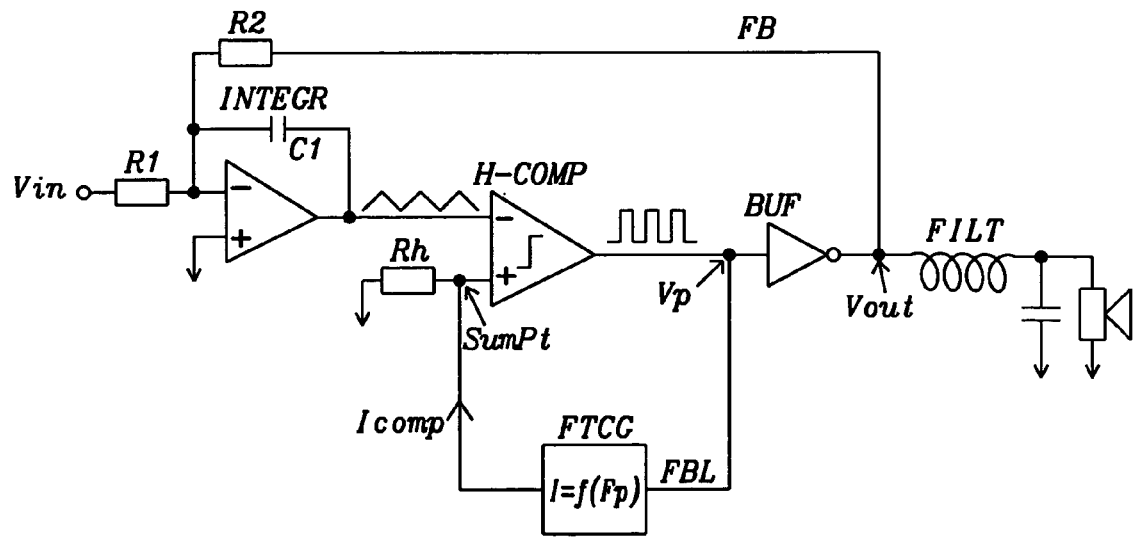
FIG. 3

FREQUENCY STABILIZATION TECHNIQUE FOR SELF OSCILLATING MODULATOR

BACKGROUND OF THE INVENTION (1) Field of the Invention

The present invention relates to self-oscillating pulse width modulators, using a hysteretic comparator to change the output duty cycle according to the input signal.

(2) Description of Prior Art

A pulse width modulator (PMW) creates an output square wave where the duty cycle depends on its Input signal. PWM's are widely used within e.g. Class-D amplifiers or switching voltage regulators, where the output load is switched either to the negative or the positive supply, by simple MOSFET switches. Using a self oscillating (or hysteretic) modulator type results in very low noise and distortion values. However, compared to the conventional PWM type with fixed (external) clock, the switching frequency is not constant, but varies significantly with input signal amplitude, output power and with supply voltage.

FIG. 1 shows one conceptual circuit diagram of a self-oscillating pulse width modulator and FIG. 2 demonstrates as one example the variation of frequency with large amplitude of a sinusoidal signal input (Vin). The moving frequency (Fp) can create several problems: with large input signal amplitude, i.e. per high modulation depths Fp becomes very low and may interfere with the (audio) signal. Further the switching noise created on the supply line disturbs other circuits and can't be filtered effectively, due to the wide frequency range. Such standard hysteretic PWM's of prior art are described in all patent references mentioned below.

U.S. Pat. No. 5,160,896 (to David McCorkle) describes a circuit to limit or regulate the switching frequency, e.g. by modifying the comparator hysteretis dependent on the Input voltage, using an analog multiplier to provide a varying hysteretic voltage.

U.S. Pat. No. 6,107,875 (to Stuart Pullen, et al.) describes a variable Class-D modulator that uses gain compression to ensure that switching frequency never falls below a minimum target.

U.S. Pat. No. 6,297,693 (to Stuart Pullen) discloses a circuit using an amplifier that synchronizes an external clock input the summing node of the integrator, an amplifier that gates an external clock to the modulator and an amplifier that adjusts its own hysteretic.

SUMMARY OF THE INVENTION

The objective of this invention is to provide an effective frequency control method for self oscillating modulators which does not produce significant extra distortion in contrast to actual self oscillating pulse width modulators, that have disadvantages because the switching frequency is not constant, but varies significantly with input signal amplitude, output power and with supply voltage.

A typical self-oscillating pulse width modulator comprises an integrator, integrating the input signal, a hysteretic comparator, typically, but not necessarily followed by a buffer circuit and a feedback signal path, returning the output signal pulses to the integrator.

One key element of the invention is a frequency to threshold correction value generator, implemented in a first additional feedback loop, built by a circuit and method to measure the pulse frequency of the pulse width modulator and convert it into a signal, which is basically proportional to the frequency, to produce an appropriate correction signal. The resulting signal is then further fed to a threshold summing point, where the switching threshold of the hysteretic comparator is modified or shifted in order to stabilize the frequency. Said first additional feedback loop regulates the pulse frequency in a continuous-time "smooth" mode.

The nature of a hysteretic comparator causes the threshold point of a hysteretic comparator to shift up and down with each switching operation. It is obvious, the optimum shift of threshold voltage might be different if the comparator's output phase is actually positive or negative. As a consequence said threshold correction signal to be fed into the threshold summing point must assume two different values, dependent on the actual status of the hysteretic comparator's output phase. Ideally, if the hysteretic switching characteristic is symmetric, the same absolute correction value with just positive or negative polarity could be applied as the two threshold correction signals.

A second key element of the invention is therefore a correction value selector, implemented in a second additional feedback loop and using a circuit and method to alternate between said two threshold correction signals, which is dependent on the hysteretic comparator's actual output pulse status. Said alternating mechanism would receive said threshold correction values which are produced by said frequency to threshold correction value generator and would then provide that selected signal, intended to shift the hysteretic comparator's threshold voltage, to said threshold summing point. Said second additional feedback loop operates in a discrete binary "switching" mode.

In case said hysteretic comparator is not fully symmetric in its operation, the optimum may require two different values of said correction signal to be provided, followed by said alternating mechanism, that selects one of said two correction values, depending on the hysteretic comparator's output phase. However, as long as said hysteretic comparator is symmetric in its operation, which is often the case, the optimum is to produce just one signal, representing the absolute value of the correction signal and to just mirror said one signal to provide said two threshold correction signals with the same absolute value, but with opposite polarity. One of said correction signals is then selected and provided to said threshold summing point.

As a summary, in an ideal situation, said frequency to threshold correction value generator produces the absolute value of the threshold correction signal (absolute value of change) and said alternating mechanism determines the polarity of said threshold correction signal (direction of change). As already mentioned, said first additional feedback loop regulates the pulse frequency in a continuous-time "smooth" mode and said second additional feedback loop operates in a discrete binary "switching" mode, thus perfectly separating the analog and the digital functions of the circuit.

It is a further concept of the invention to implement said frequency to threshold correction value generator with a switched capacitor circuit technique, followed by a low pass filter. Said two threshold correction values to be switched by the alternating mechanism are then produced by a current or voltage mirroring technique.

BRIEF DESCRIPTION OF THE DRAWINGS

In the accompanying drawings, forming a material part of this description, there is shown:

FIG. 1 (Prior Art) shows one conceptual circuit diagram of a self-oscillating pulse width modulator.

FIG. 2 (Prior Art) demonstrates, as one example, the variation of frequency with large amplitude of a sinusoidal signal input.

FIG. 3 visualizes the concept of a first additional feedback loop to regulate the self-oscillating frequency.

DESCRIPTION OF THE PREFERRED EMBODIMENTS

Figure 4:
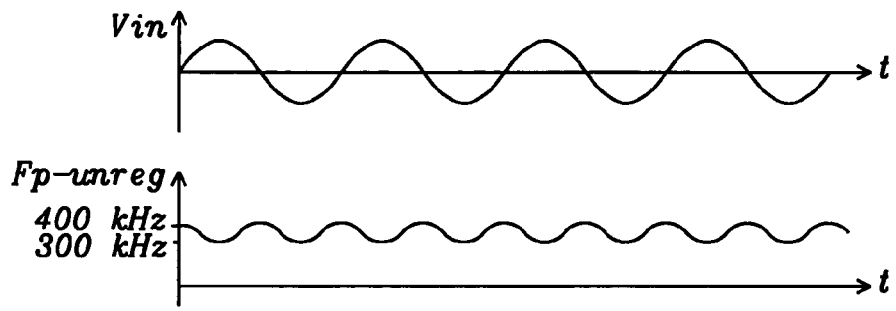
FIG. 4 demonstrates, as one example, the significantly reduced variation of frequency with large amplitude of a sinusoidal signal input according to the invention.

It is an objective of the disclosed invention to provide an effective frequency control method for self-oscillating modulators which does not produce significant extra distortion.

Actual self oscillating pulse width modulators have disadvantages as the switching frequency is not constant, but varies significantly with input signal amplitude, output power and with supply voltage. As they typically operate in the range of several hundred kHz, they often interfere with AM-radio frequencies.

A typical self-oscillating pulse width modulator comprises an integrator, integrating the input signal, a hysteretic comparator, typically, but not necessarily followed by a buffer circuit and a feedback signal path, returning the output signal pulses to the integrator. The self oscillating (or hysteretic) modulator type benefits from theoretically infinite loop gain, resulting in very low noise and distortion values. Compared to the conventional PWM type (which uses some kind of external clock), the switching frequency is not constant, but varies with input signal amplitude Vin, output power and supply voltage, as shown in FIG. 2. The moving frequency Fp can create several problems: with large input signal amplitude, i.e. with high modulation depths the pulse frequency Fp becomes very low and may interfere with the (audio) signal. The switching frequency is minimum for the largest absolute amplitudes. In addition, whenever the output signal approaches either supply line (Vdd or Vss) the switching frequency tends to become very low. Further the switching noise created on the supply line disturbs other circuits and can't be filtered effectively due to the wide frequency range.

As shown in the conceptual circuit of FIG. 1, the self oscillating pulse width modulator contains an integrator INT, a hysteretic comparator H-COMP, a buffer BUF and the feedback FB. The Integrator INTEGR is built by an operational amplifier and the integrating components capacitor C1 and resistor R1. The hysteretic comparator H-COMP is represented by a switching comparator and the external component Rh. See also FIG. 6a with the two resistor Rh and Rfb defining the hysteresis and Vref as the reference voltage. An optional buffer stage BUF isolates the output Vout from said hysteretic comparator H-COMP. The digital output signal typically passes some form of low pass filter FILT. The feedback FB through resistor R2 closes the loop of said self-oscillating pulse width modulator.

One key element of the invention is a frequency to threshold correction value generator, implemented in a first additional feedback loop, built by a circuit and method to measure the pulse frequency of the pulse width modulator and convert it into a signal, which is basically proportional to the frequency, to produce an appropriate correction signal. The resulting signal is then fed to a summing point, where the switching threshold of the hysteretic comparator is modified in order to stabilize the frequency. Said first additional feedback loop regulates the pulse frequency in a continuous-time "smooth" mode.

The invention may best be understood by referring to the following descriptions and accompanying drawings, which illustrate the invention. FIG. 3 shows the same basic circuit of FIG. 1 with the first development step for an additional feedback loop FBL, implementing a frequency to threshold correction generator FTCG and connected between the hysteretic comparator's output with the signal Vp and the threshold summing point SumPt. Said frequency to threshold correction generator feeds its output signal Icomp, which has a value proportional to the pulse frequency, into resistor Rh, causing the comparator's threshold to shift accordingly.

As the threshold point of a hysteretic comparator shifts up and down with each switching operation. It is obvious, the optimum shift of threshold voltage might be different if the output pulse is actually positive or negative. As a consequence said threshold correction signal to be fed into the threshold summing point must assume two different values, dependent on the actual status of the hysteretic comparator's output. Ideally however, if the hysteretic switching characteristic is symmetric, a correction signal with the same absolute value with just positive or negative polarity could be applied as the two threshold correction signals.

A second key element of the invention therefore is a correction value selector, implemented in a second additional feedback loop, using a circuit and method to alternate between said two threshold correction signals, which is dependent on the hysteretic comparator's actual output phase. Said alternating mechanism would receive said threshold correction values which are proportional to the pulse frequency and would then provide that selected signal intended to shift the hysteretic comparator's threshold voltage. Said second additional feedback loop operates in a discrete binary "switching" mode.

In case said hysteretic comparator is not fully symmetric in its operation, the optimum may require two different values of said correction signal to be provided, followed by said alternating mechanism, that selects one of said two correction values, depending on the hysteretic comparator's output phase. However, as long as said hysteretic comparator is symmetric in its operation, which is often the case, the optimum is to produce just one signal, representing the absolute value of the correction signal and to just mirror said one signal to provide said two threshold correction signals with the same absolute value, but with opposite polarity. One of said correction signals is then selected and provided to said threshold summing point.

FIG. 4 illustrates as one example the variation of frequency with large amplitude of a sinusoidal signal input Vin with the additional feedback implemented, which compensates for frequency variation. Variation of the pulse frequency Fp is now significantly reduced compared to the situation in FIG. 2.

Figure 5A:
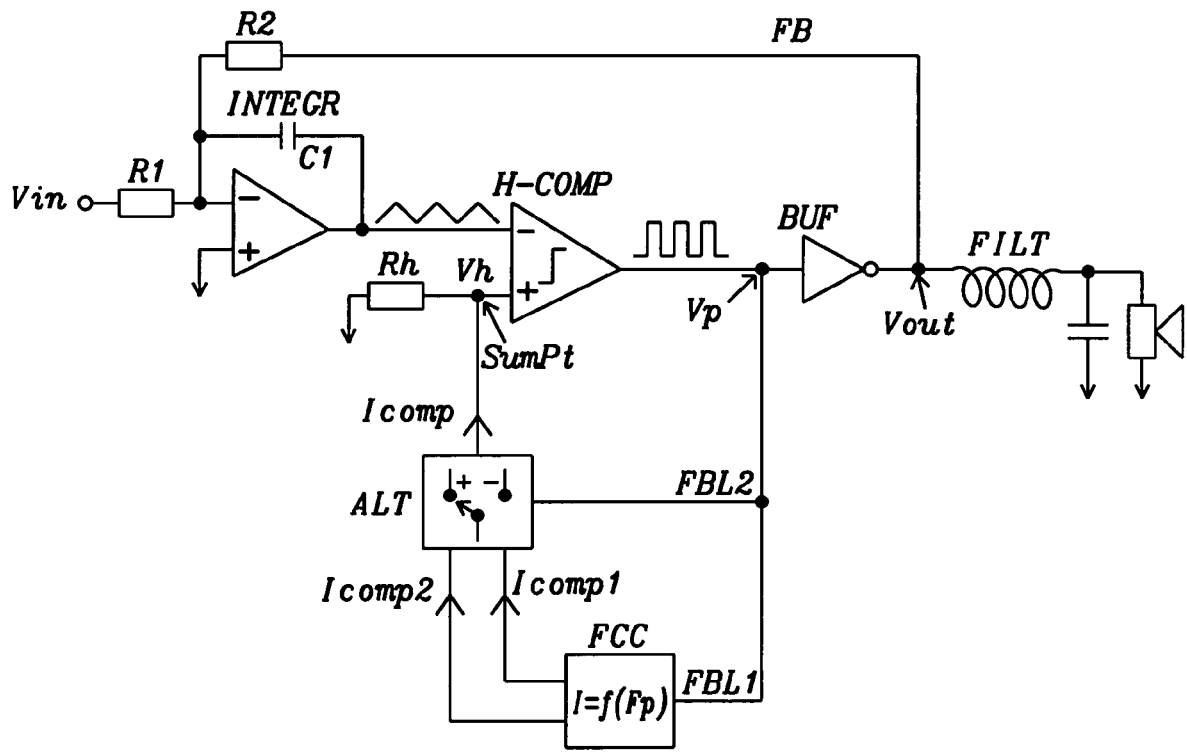
FIG. 5a visualizes the concept of a first and a second additional feedback loop to regulate the self-oscillating frequency in a non-symmetric situation.
Figure 5B:
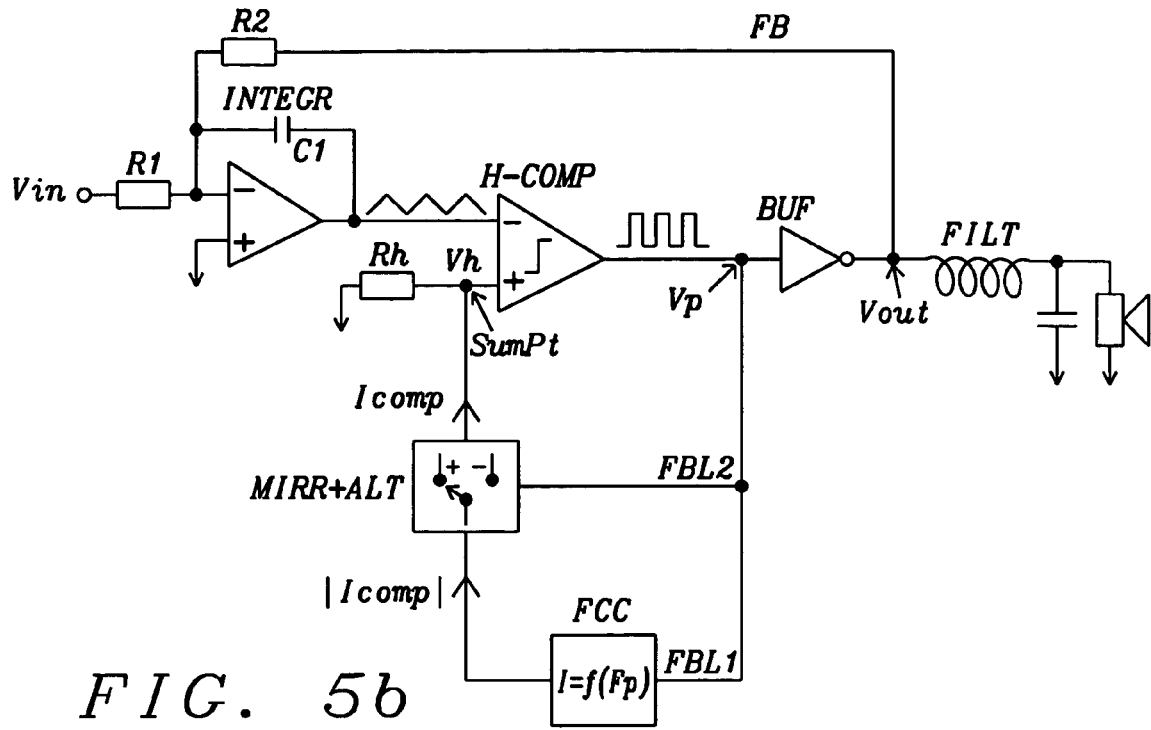
FIG. 5b visualizes the concept of a first and a second additional feedback loop to regulate the self-oscillating frequency in a symmetric situation.

FIG. 5a and FIG. 5b now show both, said first additional feedback loop FBL1 and said second additional feedback loop FBL2, the combination of both connected between the hysteretic comparator's output with the signal Vp and the threshold summing point SumPt. In the shown example in FIG. 5a, assuming a non-symmetric situation, said frequency to threshold correction value generator is implemented for example with a frequency to current converter FCC, producing two compensation signals as current Icomp1 and Icomp2 and, further, with an alternating mechanism ALT selecting one of the two provided compensation signals, depending on the hysteretic comparator's output phase. In the shown example in FIG. 5b, assuming a more symmetric situation, said frequency to threshold correction value generator is implemented for example with a frequency to current converter FCC, producing a single compensation signal as current |Icomp| and, further, with a mirroring and alternating mechanism MIRR+ALT, made of a current mirror and the appropriate switches, providing Icomp with positive or negative polarity. In both examples, FIG. 5a and FIG. 5b, the resulting compensation signal is fed as current Icomp into said threshold summing point SumPt, which then results in the hysteresis voltage Vh at said hysteretic comparator's input.

In the case of a non-symmetric switching characteristic of the hysteretic comparator, where 2 different correction values Icomp1 and Icomp2 are to be provided as in FIG. 5a, the frequency compensating signals may be produced according to the following formulas:

$$Icomp1 = +k1*Fp + Iadd1$$

$$Icomp2 = -k2*Fp + Iadd2$$

with k1, k2=design constant, e.g. measurement gain; Fp=frequency of pulses; Iadd1, Iadd1=additive component.

In the case of a symmetric switching characteristic of the hysteretic comparator, where a single absolute value |Icomp| is to be provided, as in FIG. 5b, the frequency compensating signal may be produced according to the following formula:

$$|Icomp| = k*Fp + Iadd$$

with k=design constant, e.g. measurement gain; Fp=frequency of pulses; Iadd=additive component.

Figure 6A:
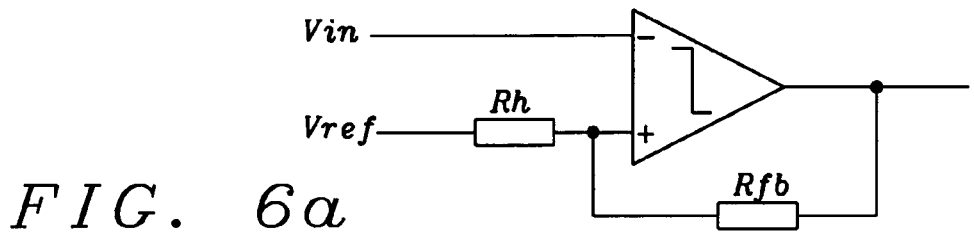
FIG. 6a shows the principal circuit of a hysteretic comparator.
Figure 6B:
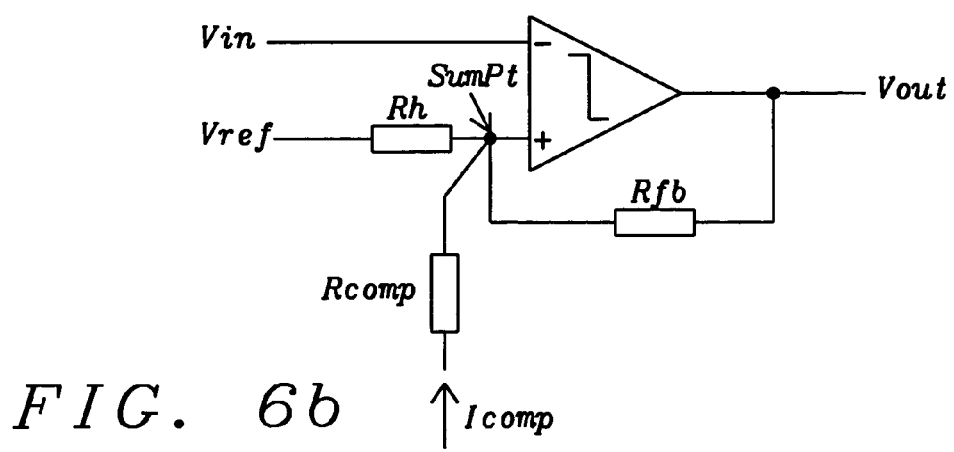
FIG. 6b shows the principal circuit of a hysteretic comparator with the additional correction signal fed into a switching threshold correction summing point.

FIG. 6b serves to illustrate the realization of a normal hysteretic comparator, using the same circuit as in FIG. 6a and with the addition of a threshold shifting function. In FIG. 6b the threshold compensation current Icomp feeds through resistor Rcomp into the threshold summing point SumPt. The relevant resistance to calculate the relevant voltage shift, which is caused by said compensation current is the parallel connection of Rh and Rfb.

As a summary, in an ideal situation, said frequency to threshold correction value generator produces the absolute value of the threshold correction signal (absolute value of change) and said alternating mechanism determines the polarity of said threshold correction signal (direction of change). As already mentioned, said first additional feedback loop regulates the pulse frequency in a continuous-time "smooth" mode and said second additional feedback loop operates in a discrete binary "switching" mode, thus perfectly separating the analog and the digital functions.

Figure 7:
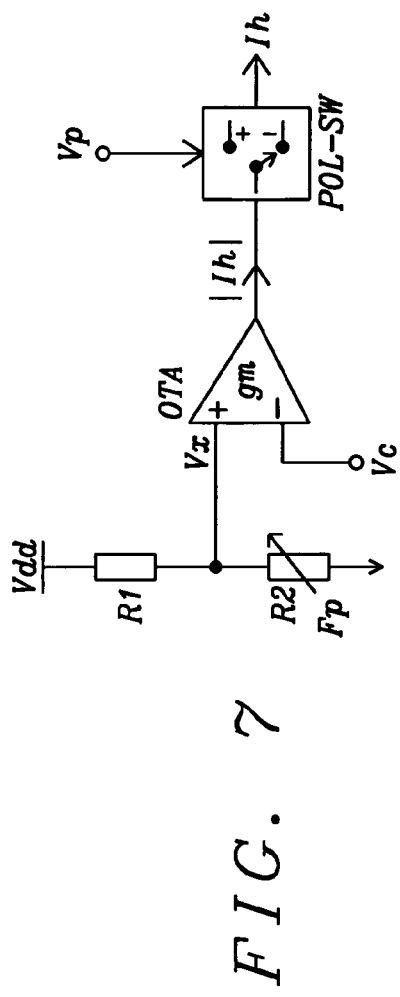
FIG. 7 visualizes the basic concept of a frequency to current converter followed by a polarity alternating mechanism.
Figure 8:
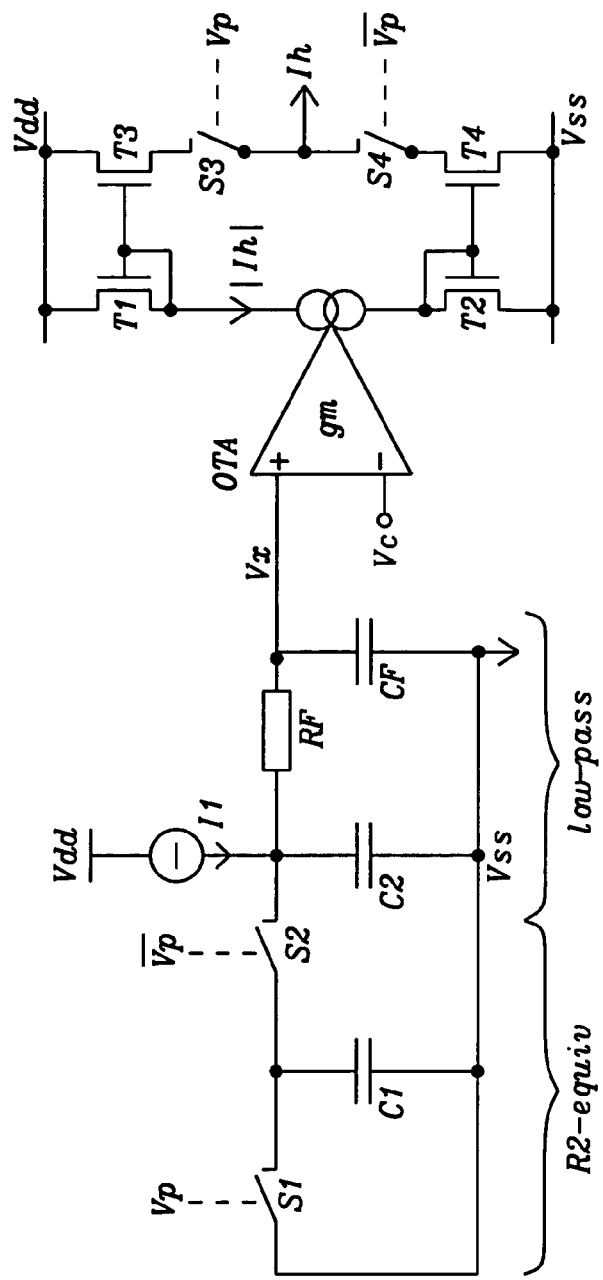
FIG. 8 shows a course circuit diagram for a realization of a frequency to current converter followed by a polarity alternating mechanism.
Figure 9:
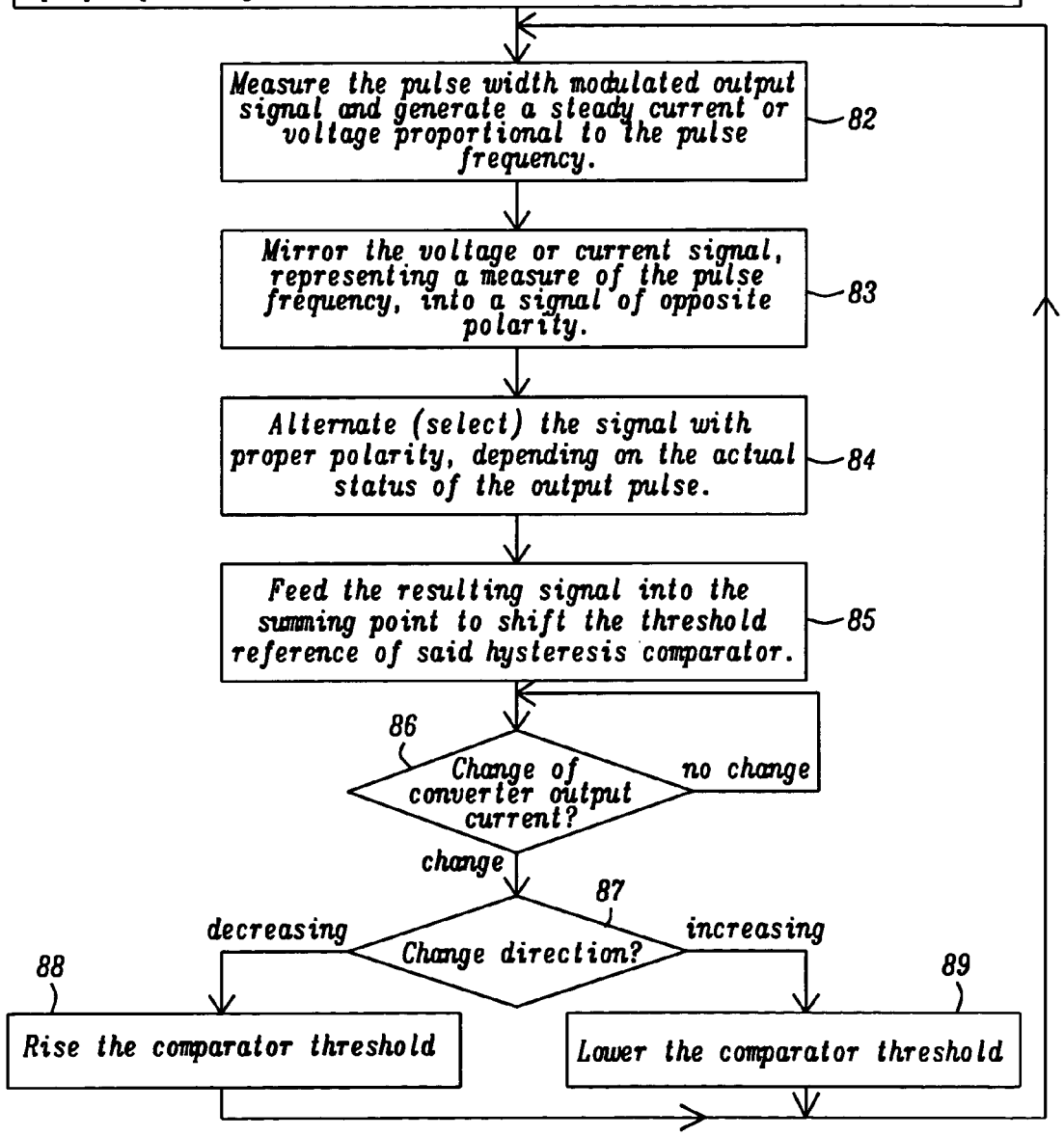
FIG. 9 shows a method diagram for a frequency stabilization.

It is a further concept of the invention to implement said frequency to threshold correction value generator with a switched capacitor circuit technique, followed by a low pass filter. Said two threshold correction values to be switched by the alternating mechanism are then produced by a current or voltage mirroring technique. FIG. 7 illustrates the basic block diagram of such a concept, whereas FIG. 8 shows the same concept in some more detail, implemented with a frequency to current converter and with a current mirror. As an example in FIG. 7, a frequency dependent element, built by a frequency constant element R1 and a frequency variable element R2, produce a signal with steady dependence on the frequency Fp, and feeds a transconductance amplifier OTA to produce the absolute (frequency dependent) current |Ih|. The alternating mechanism POL-SW then selects the polarity of Ih, to be finally supplied to said threshold correction summing point.

The switched capacitor circuit in FIG. 8, built by C1 and C2 and by S1 and S2, that are alternately controlled by Vp and inverted Vp, represent a frequency dependent element. A subsequent low pass filter, built by RF and CF, is smoothing the resulting voltage Vx. The frequency constant element (refer to FIG. 7) could be a resistive element—it could, as shown in the example of FIG. 8, even be a constant current source I1. The transconductance amplifier OTA then produces a (frequency dependent) current with absolute value |Ih|. The current mirror arrangement, built by transistors T1 to T4, produces current +Ih and −Ih. And finally, the selection mechanism, made of switches S3 and S4, which are controlled by Vp and inverted Vp, provide said threshold compensation signal Ih to said threshold correction summing point.

The hysteresis voltage Vh operates according to:

$$|Vh| = (I1/(Fp*C1) - Vc)*gm*Rh$$

with Vh=the hysteresis voltage at the comparator input;

I1=the current of the constant current source;

Fp=the pulse frequency

Vc=reference voltage at the OTA;

gm=gain of transconductance amplifier

Rh=resistor at the threshold correction summing point.

The method to significantly reduce the frequency variation of a self-oscillating pulse width modulator provides the means for a self oscillating pulse width modulator, comprising an integrator, a hysteretic comparator, an output buffer and a feedback loop for the output signal to said integrator input, a first additional feedback loop with a frequency to threshold correction value generator, comprising means to generate a signal representing a measure of the pulse frequency; and a second additional feedback loop with a correction value selector, comprising means to alternate the polarity of said signal representing a measure of the pulse frequency depending on the output pulse status and a feedback summing point at the hysteretic comparator's threshold reference input, receiving the combined signal built by the signal representing a measure of the pulse frequency and switched to the proper polarity and value (81).

The method first takes a signal probe at the hysteretic comparator output or it takes a signal probe of the pulse width modulated pulses, then generates, typically one or two signals, which are a measure of the frequency of said pulse width modulated pulses (82). In the case of a non-ideal, i.e. non-symmetric, situation, it produces two values of different polarity. In case of an ideal symmetric situation, it produces a single absolute value, which is then mirrored into two signals of identical value, but of opposite polarity (83). Then an alternating mechanism selects, depending on the actual output phase of said hysteric comparator, which value or polarity to select (84). Then the threshold correction signal is fed into the threshold correction summing point (85). Whenever the frequency to threshold correction value generator indicates a change (86), the hysteretic comparator's threshold voltage is modified depending on the direction of change (87), by either rising (88) or lowering (89) the threshold voltage.

While the invention has been particularly shown and described with reference to the preferred embodiments thereof, it will be understood by those skilled in the art that various changes in form and details may be made without departing from the spirit and scope of the invention.

What is claimed is:

1. A circuit to significantly reduce the frequency variation of a self-oscillating pulse width modulator which comprises an integrator, a hysteretic comparator and a feedback path from said hysteretic comparator's output to said integrator's input, comprising:
   means to generate one or more signals representing a measure of the pulse frequency of said self-oscillating pulse width modulator;
   means for an alternating mechanism;
   means for a feedback summing point, allowing to shift the threshold reference voltage of said hysteretic comparator;
   means for a frequency to threshold correction value generator, implemented in a first additional feedback loop, connecting said hysteretic comparator's output signal to said means to generating one or more signals representing a measure of the pulse frequency and connecting the resulting signal to said means for an alternating mechanism; and
   means for a correction value selector, implemented in a second additional feedback loop, connecting said hysteretic comparator's output signal to said means for an alternating mechanism, to control the selection of one of two values of said signals representing a measure of the pulse frequency, depending on the actual status of said hysteretic comparator's output and connecting the resulting combined signal to said feedback summing point.

2. The circuit of claim 1 wherein said means for a frequency to threshold correction value generator produces two values for a correction signal, based on said measure of the pulse frequency, the first value to be used when the actual output phase of said hysteretic comparator is positive and the second value to be used when the actual output phase of said hysteretic comparator is negative and where said alternating mechanism selects one of both values.

3. The circuit of claim 2 wherein said two values are basically proportional to the frequency measured, each multiplied by an individual factor and with a constant value added.

4. The circuit of claim 1 wherein said means for a frequency to threshold correction value generator produces a single absolute value for a correction signal, based on said measure of the pulse frequency, where the same absolute value is used for both phases of said hysteretic comparator, where a mirroring process provides two signals of the same absolute value, but with opposite polarity, and where said alternating mechanism selects one of both values.

5. The circuit of claim 4 wherein said single absolute value is basically proportional to the frequency measured, multiplied by a factor and with a constant value added.

6. The circuit of claim 1 wherein said correction value selector selects the polarity of said correction signal, which is based on said measure of the pulse frequency by switching the positive or negative of said absolute value to said feedback summing point.

7. The circuit of claim 1 wherein said means to generate a signal representing a measure of the pulse frequency, produce a current steadily varying with the pulse frequency, thus forming a frequency to current converter.

8. The circuit of claim 7 wherein the circuit which produces a current, steadily varying with the pulse frequency and which represents a measure of the pulse frequency, operates proportional to said pulse frequency.

9. The circuit of claim 7 wherein the circuit which produces a current, steadily varying with the pulse frequency and which represents a measure of the pulse frequency, operates steady but nonlinear in relation to said pulse frequency.

10. The circuit of claim 7 wherein said means for a frequency to current converter are built by at least one frequency constant element and at least one frequency variable element.

11. The circuit of claim 10 wherein said frequency variable element is implemented as a switched capacitor arrangement.

12. The circuit of claim 7 wherein said means for a frequency to current converter implements the means for a transconductance amplifier.

13. The circuit of claim 1 wherein said means for a feedback summing point, allowing to shift the threshold reference voltage of said hysteretic comparator is primarily made of a resistor network.

14. The circuit of claim 1 wherein said means for a feedback summing point is substituted by semiconductor components simulating a resistive network.

15. The circuit of claim 1 wherein said means to generate a signal representing a measure of the pulse frequency, produce a voltage steadily varying with the pulse frequency, thus forming a frequency to voltage converter.

16. The circuit of claim 15 wherein the circuit which produces a voltage, steadily varying with the pulse frequency and which represents a measure of the pulse frequency, operates proportional to said pulse frequency.

17. The circuit of claim 15 wherein the circuit which produces a voltage, steadily varying with the pulse frequency and which represents a measure of the pulse frequency, operates steady but nonlinear in relation to said pulse frequency.

18. The circuit of claim 15 wherein said means for a frequency to voltage converter is built by at least one frequency constant element, one frequency variable element.

19. The circuit of claim 1 wherein said means for an alternating mechanism provide at their output either a positive or a negative current of the same value as at their input, by using a current mirroring technique.

20. The circuit of claim 1 wherein the feedback signal for said first additional feedback loop is, instead of connecting it to said hysteretic comparator's output, connected to an equivalent signal along the signal path of the pulse width modulating circuit.

21. The circuit of claim 1 wherein the feedback signal for said second additional feedback loop is, instead of connecting it to said hysteretic comparator's output, connected to an equivalent signal along the signal path of the pulse width modulating circuit.

22. The circuit of claim 1 wherein said frequency to threshold correction value generator and said correction value selector are implemented in the form of highly integrated semiconductor building blocks.

23. A method to significantly reduce the frequency variation of a self-oscillating pulse width modulator, comprising means for the basic circuits for a self oscillating pulse width modulator, means to generate a signal representing a measure of said pulse frequency, means for an alternating mechanism, means for a frequency to threshold correction value generator, means for a correction value selector, and means for a feedback summing point;
  taking a signal probe at the hysteretic comparator output or of the pulse width modulated pulses;
  generating signals, which are a measure of the frequency of said pulse width modulated pulses;
  selecting one of said signals, which are a measure of the frequency of said pulse width modulated pulses, depending on the actual phase of the hysteretic comparator's output;
  feeding the selected signal into said threshold correction summing point; and
  shifting the threshold voltage to compensate the frequency variation.

24. The method of claim 23 where generating signals, which are a measure of the frequency of said pulse width modulated pulses produces two values for a correction signal, the first value to be used when the actual output phase of said hysteretic comparator is positive and the second value to be used when the actual output phase of said hysteretic comparator is negative.

25. The method of claim 24 wherein producing said two values for a correction signal, produces values that are basically proportional to the frequency measured, each multiplied by an individual factor and with a constant value added and where said alternating mechanism then selects one of both values to be provided to said threshold correction summing point.

26. The method of claim 23 wherein feeding said selected signal into said threshold correction summing point selects one of the mirrored signals and feeds the resulting signal to the threshold correction summing point.

27. The method of claim 23 where generating signals, which are a measure of the frequency of said pulse width modulated pulses produces a single absolute value for a correction signal, where the same absolute value is used for both phases of said hysteretic comparator, where said mirroring stage produces two signals with positive or negative polarity, but of the same absolute value and where said alternating mechanism provides said threshold correction signal to said threshold correction summing point.

28. The method of claim 27 wherein, in order to provide said single value with positive or negative polarity, the signal is mirrored into two signals of the same value, but of opposite polarity.

29. The method of claim 27 wherein producing said single absolute value for a correction signal, produces a value that is basically proportional to the frequency measured, multiplied by a factor and with a constant value added and where said alternating mechanism then provides said single value with positive or negative polarity to said threshold correction summing point.

30. The method of claim 23 wherein generating a signal representing a measure of the pulse frequency, produces a current steadily varying with the pulse frequency, thus performing a frequency to current conversion.

31. The method of claim 30 wherein producing a current, steadily varying with the pulse frequency and representing a measure of the pulse frequency, operates proportional to said pulse frequency.

32. The method of claim 30 wherein producing a current, steadily varying with the pulse frequency and representing a measure of the pulse frequency, operates steady but nonlinear in relation to said pulse frequency.

33. The method of claim 23 wherein generating a signal representing a measure of the pulse frequency, produces a voltage steadily varying with the pulse frequency, thus performing a frequency to voltage conversion.

34. The method of claim 33 wherein producing a voltage, steadily varying with the pulse frequency and representing a measure of the pulse frequency, operates proportional to said pulse frequency.

35. The method of claim 33 wherein producing a voltage, steadily varying with the pulse frequency and representing a measure of the pulse frequency, operates steady but nonlinear in relation to said pulse frequency.

* * * * *